United States Patent
Egawa (10) Patent No.: US 8,143,718 B2
(45) Date of Patent: Mar. 27, 2012

(54) SEMICONDUCTOR DEVICE HAVING STRESS RELAXATION SECTIONS

(75) Inventor: Yoshimi Egawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 717 days.

(21) Appl. No.: 11/406,232

(22) Filed: Apr. 19, 2006

(65) Prior Publication Data

US 2006/0220261 A1 Oct. 5, 2006

(30) Foreign Application Priority Data

Mar. 30, 2005 (JP) ................................ 098591/2005

(51) Int. Cl.
*H01L 23/34* (2006.01)

(52) U.S. Cl. . 257/723; 257/777; 257/778; 257/E23.003; 257/E23.011

(58) Field of Classification Search ................... 257/698, 257/723, 777, 778, E23.003, E23.011
See application file for complete search history.

(56) References Cited

U.S. PATENT DOCUMENTS

| | | | | |
|---|---|---|---|---|
| 6,727,582 B2 * | 4/2004 | Shibata | ......................... | 257/723 |
| 6,873,035 B2 * | 3/2005 | Watanabe et al. | ............. | 257/686 |
| 7,291,929 B2 * | 11/2007 | Tanaka et al. | .................. | 257/784 |
| 2004/0070064 A1 * | 4/2004 | Yamane et al. | ................ | 257/686 |
| 2004/0201097 A1 | 10/2004 | Ohsumi | | |
| 2007/0158832 A1 * | 7/2007 | Takaike | ......................... | 257/734 |

FOREIGN PATENT DOCUMENTS

| | | | |
|---|---|---|---|
| JP | 6224259 | | 8/1994 |
| JP | 11317383 | | 11/1999 |
| JP | 2004-273525 | | 9/2004 |
| JP | 2004273525 | | 9/2004 |
| JP | 2004273525 A | * | 9/2004 |
| JP | 2004319638 | | 11/2004 |

* cited by examiner

*Primary Examiner* — Matthew E Warren
(74) *Attorney, Agent, or Firm* — Volentine & Whitt, PLLC (57) ABSTRACT

A semiconductor device having a semiconductor substrate including a first surface and a second surface corresponding to a back surface with respect to the first surface and having first through electrodes which extend through the first surface and the second surface, semiconductor chips which are mounted over the first surface of the semiconductor substrate and each of which is constituted of a material of the same kind as the semiconductor substrate and has a circuit element electrically connected to the first through electrodes, stress relaxing sections which are provided with first conductors formed over the second surface of the semiconductor substrate and electrically connected to the first through electrodes of the semiconductor substrate and having flexibility, and external connecting terminals provided over the stress relaxing sections and connected to the first conductors respectively.

19 Claims, 9 Drawing Sheets

SEMICONDUCTOR DEVICE HAVING STRESS RELAXATION SECTIONS

BACKGROUND OF THE INVENTION

The present invention relates to a semiconductor device and a manufacturing method thereof. The present invention relates particularly to a three-dimensionally mounted semiconductor device and a manufacturing method thereof.

In order to meet the demand for miniaturization of semiconductor devices, multi chip packages have heretofore been used in which a plurality of semiconductor chips are mounted in a single package to enhance packaging densities of the semiconductor devices. As one of them, there is known a three-dimensionally mounted structure wherein a plurality of semiconductor chips are laminated on a wiring board (interposer) in a vertical direction and signals are transmitted via through electrodes respectively provided in the interposer and the respective semiconductor chips. Comparing the three-dimensionally mounted structure provided with the through electrodes and a plane-mounted structure in which a plurality of semiconductor chips are mounted onto a wiring board on a plane basis, a wiring length between the wiring board with the chips mounted thereon and each of the semiconductor chips, and a wiring length between the mutual semiconductor chips can be shortened. It is therefore possible to perform transmission of signals among functional elements formed in the respective semiconductor chips at high speed. Since the wiring board is connectable to a mounting board or printed circuit board via external connecting terminals provided on a surface below the wiring board, wiring lengths for external connection can also be shortened and the transmission of signals to the outside can also be carried out at high speed.

As this type of technique, there has been known a three-dimensionally mounted structure using a semiconductor material for a wiring board as described in, for example, a patent document 1 (Japanese Unexamined Patent Publication No. 2003-110084), which corresponds to U.S. Pat. No. 6,727, 582. The wiring board 1 constituted of the semiconductor material includes wirings (L11, L12, L13 and L123) formed in a semiconductor chip mounting surface 1a by a semiconductor process such as photolitho-etching. Thus, wiring widths and wiring pitches can be narrowed as compared with wirings of a wiring board (hereinafter called "insulated board") unable to utilize the semiconductor process. With the formation of the wiring board 1 and a semiconductor chip 2 by a semiconductor material of the same kind, failures in connection between the wiring board 1 and the semiconductor chip 2, which occur due to the difference in linear expansion coefficient upon heat treatment, can be reduced.

Since, however, a substrate (hereinafter called "mounting board") with a semiconductor device mounted thereon is not a semiconductor material in general, a wiring board 1 (hereinafter called "semiconductor substrate") constituted of the semiconductor material and the mounting board 10 differ in linear expansion coefficient from each other when the semiconductor material is used as the wiring board, as in the technique disclosed in the patent document 1. There was a possibility that due to the difference in linear expansion coefficient, failures in connection such as the occurrence of cracks in external connecting terminals 8 connected to the mounting board 10 would occur after mounting upon heat treatment executed upon mounting of the semiconductor device onto the mounting board 10.

SUMMARY OF THE INVENTION

The present invention has been made in view of the foregoing. It is therefore an object of the present invention to provide a semiconductor device capable of reducing failures in connection between a wiring board or interposer and a mounting board.

According to one aspect of the present invention, for attaining the above object, there is provided a semiconductor device comprising a semiconductor substrate including a first surface and a second surface corresponding to a back surface with respect to the first surface and having first through electrodes which extend through the first surface and the second surface, semiconductor chips which are mounted on the first surface of the semiconductor substrate and each of which is constituted of a material of the same kind as the semiconductor substrate and has a circuit element electrically connected to the first through electrodes, stress relaxing sections including first conductors formed on the second surface of the semiconductor substrate and electrically connected to the first through electrodes of the semiconductor substrate and having flexibility, and external connecting terminals provided on the stress relaxing sections and connected to the first conductors respectively.

According to the representative invention of the present application, there can be provided a semiconductor device capable of reducing failures in connection between a wiring board or interposer and a semiconductor chip, which occur upon heat treatment and reducing failures in connection between the interposer and a printed circuit board, which occur upon execution of mounting with heat treatment.

BRIEF DESCRIPTION OF THE DRAWINGS

While the specification concludes with claims particularly pointing out and distinctly-claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings. Incidentally, constituent elements similar through all the drawings are respectively given the same reference numerals.

First Preferred Embodiment

Figure 1:
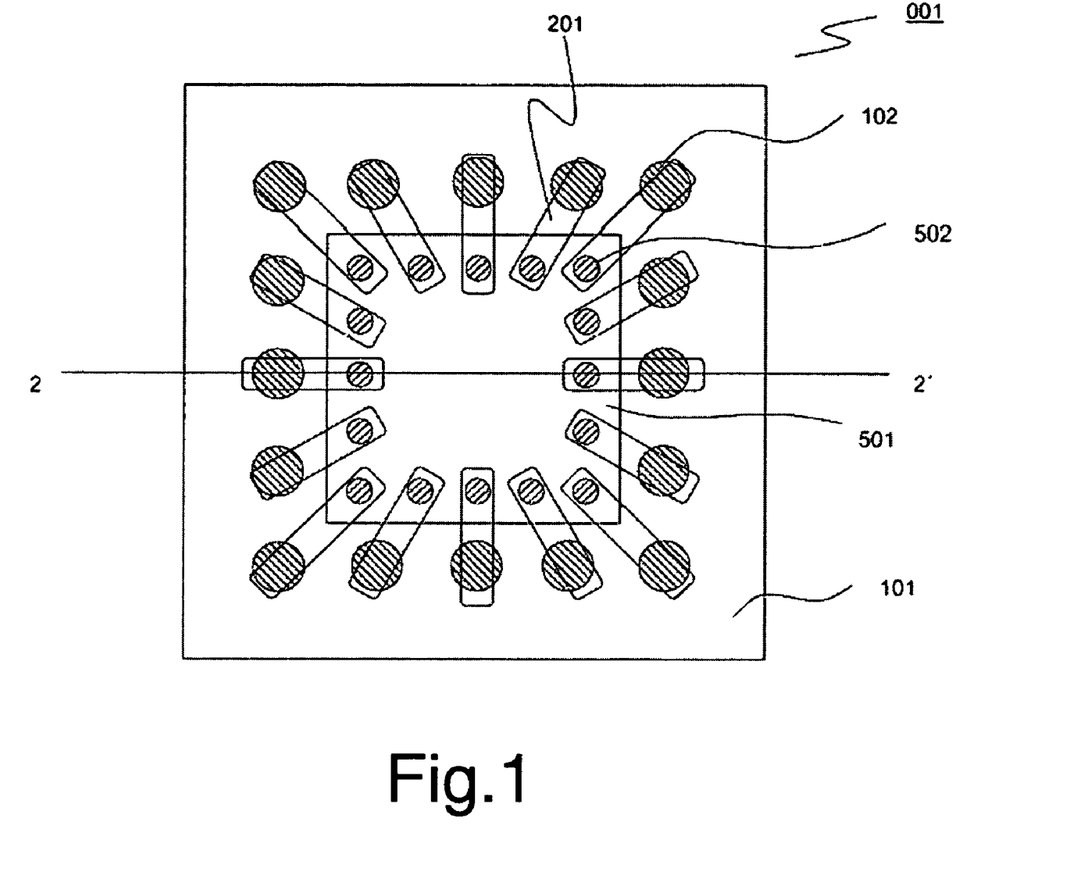
FIG. 1 is a plan view for describing a structure of a semiconductor device according to a first embodiment.
Figure 2:
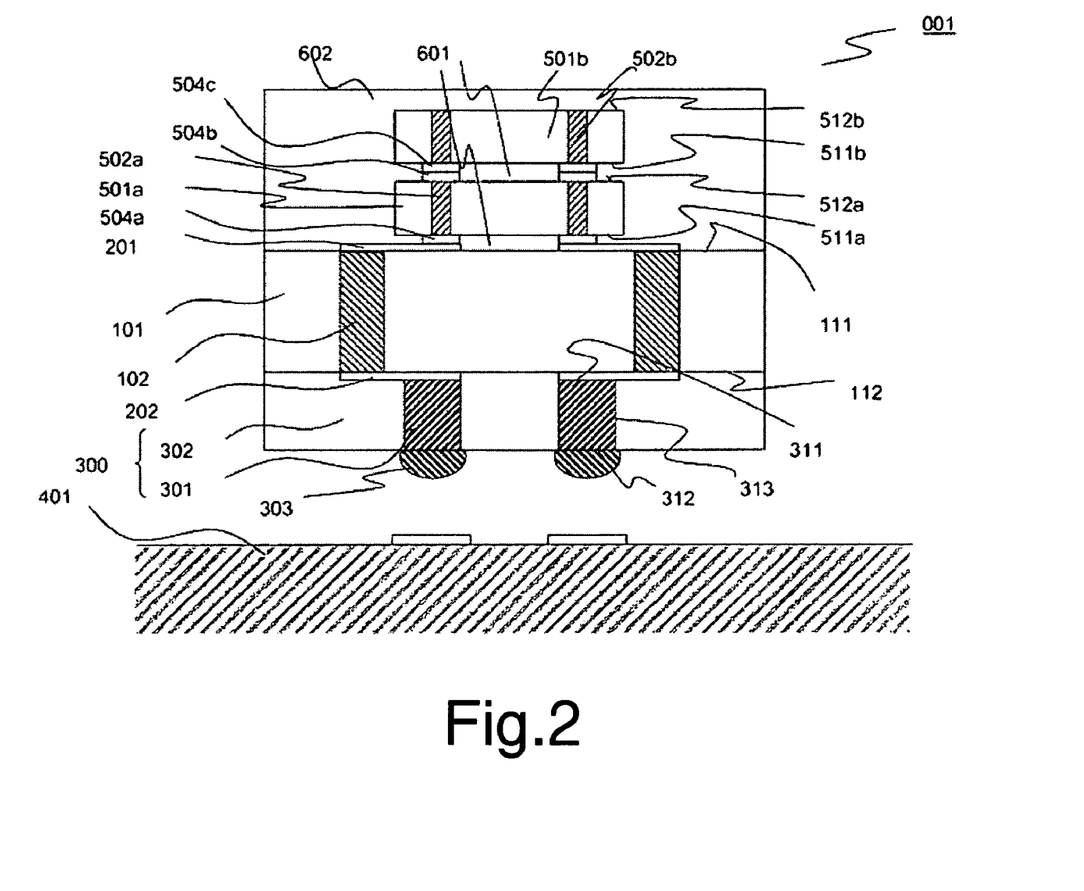
FIG. 2 is a sectional view for describing the structure of the semiconductor device according to the first embodiment.

FIG. 1 is a plan view showing a structure of a semiconductor device 001 according to a first embodiment of the present invention, and FIG. 2 is a cross-sectional view taken along line 2-2' of FIG. 1, respectively. Incidentally, FIG. 1 is shown as a plan view as seen through a semiconductor chip 501 and first conductive films 201 to make it easy to understand the structure of the semiconductor device 001 according to the first embodiment.

As shown in FIGS. 1 and 2, the semiconductor device 001 according to the first embodiment of the present invention comprises a semiconductor substrate 101, stress relaxing sections 300 each formed on a second surface 112 of the semiconductor substrate 101, external connecting terminals 303 formed on the stress relaxing sections 300, a semiconductor chip 501a and a semiconductor chip 501b laminated on a first surface 111 of the semiconductor substrate 101, and a sealing or encapsulating body or encapsulator 602 which covers the first surface 111 of the semiconductor substrate 101, the semiconductor chip 501a and the semiconductor chip 501b. Further, the semiconductor substrate 101 has first through electrodes 102.

The stress relaxing section 300 has a first conductor 301 having flexibility. Each of the first conductors 301 is electrically connected to its corresponding first through electrode 102 via a second conductive film 202. Here, the flexibility exhibits such a degree as to relax stress produced between the semiconductor substrate 101 and a printed circuit board 401 different in linear expansion coefficient and avoid the occurrence of faulty connections in the external connecting terminals 303 upon mounting with heat treatment. Each of the external connecting terminals 303 is connected to its corresponding first conductor 301. The semiconductor chip 501a has second through electrodes 502a and at least one circuit element 503a (not shown). The second through electrode 502a is connected to its corresponding first through electrode 102 via a first conductive film 201 and a connecting bump 504a. The semiconductor chip 501b has second through electrodes 502b and at least one circuit element 503b (not shown). The second through electrode 502b is connected to its corresponding second through electrode 502a via a connecting bump 504b and a connecting bump 504c. Encapsulating layers 601 are respectively formed between the semiconductor substrate 101 and the semiconductor chip 501a and between the semiconductor chip 501a and the semiconductor chip 501b.

The configuration of the stress relaxing section 300 employed in the present embodiment will next be explained.

As shown in FIG. 2, the stress relaxing section 300 has the first conductor 301 having a third surface 311 opposite to the second surface 112 and connected to the second conductive film 202, a fourth surface 312 connected to the external connecting terminal 303, and a side surface 313 that connects the third surface 311 and the fourth surface 312. The shape of the first conductor 301 may preferably be columnar, for example. The first conductor 301 is constituted of copper or the like, for example. Further, the stress relaxing section 300 has a first insulator 302 formed so as to cover the side surfaces 313 of the first conductors 301 and having elasticity. The first insulator 302 is made up of a resin such as an epoxy resin.

Since the stress relaxing section 300 is formed in the present embodiment, the external connecting terminals 303 can be displaced in the direction of the second surface 112 by tilting of the first conductors 301 in the direction of the second surface 112 even though the stress due to the difference between thermal expansion and heat shrinkage occurs between the semiconductor substrate 101 and the printed circuit board 401 different in linear expansion coefficient upon mounting with the heat treatment. It is thus possible to relax the stress developed upon mounting with the heat treatment and prevent faulty connections or failures in connection due to cracks or the like of the external connecting terminals 303, which occur upon mounting. Since the first insulator 302 is formed so as to cover the side surfaces 313 of the first conductors 301, the angle of inclination of each first conductor 301 can be controlled, and failures in connection such as breaks in the conductors 301 due to the produced stress can be prevented. Further, since the produced stress is relaxed by tilting of the first conductors 301, the distance between the third surface 311 of each first conductor 301 and the fourth surface 312 thereof, i.e., the height of the first conductor 301 may preferably be set to a range from 50 µm to 200 µm. Setting the height of the first conductor 301 to the above condition makes it possible to relax the stress and attain thinning of the semiconductor device 001.

Configurations other than the configuration of the stress relaxing section 300 will next be explained respectively.

First, the semiconductor substrate 101 is constituted of a semiconductor material (e.g., silicon) of the same sort as each of the semiconductor chip 501a and the semiconductor chip 501b mounted thereon. Thus, since the semiconductor substrate 101 and the semiconductor chips 501a and 501b can be made coincident in linear expansion coefficient with one another, stress developed due to the difference between thermal expansion and heat shrinkage can be reduced. Incidentally, since the major materials for the semiconductor substrate 101 and the semiconductor chips 501a and 501b may be of the same sort, a silicon substrate and an SOI (Silicon on Insulator) each formed with a thin film made of a material different from silicon, for example, result in a semiconductor material of the same kind.

The semiconductor substrate 101 has the first through electrodes 102 which extend through the first surface 111 and the second surface 112 over which the semiconductor chip 501a is mounted. The first through electrodes 102 are respectively electrically connected to the mounted semiconductor chip 501a, semiconductor chip 501b, first conductors 301 and external connecting terminals 303. The first through electrode 102 is constituted of a conductor and made up of, for example, copper, aluminum, polysilicon or the like. Each of the first through electrodes 102 is formed by a semiconductor process. The first through electrode 102 is formed by, for example, fabricating a mask by photolitho-etching, forming a trench portion by dry etching, thereafter charging a conductor into the trench portion by an electrolytic plating method and effecting chemical mechanical polishing on its back surface. Thus, the diameter of each first through electrode 102 can be set to about 10 to 20 µm. This can adapt even to a multi-pin configuration and multifunctioning of the semiconductor device 001.

The first conductive films 201 each provided with a first portion connected to the second through electrode 502a in the semiconductor chip 501a and a second portion connected to the first through electrode 102 of the semiconductor substrate 101 are formed on the first surface 111. The first conductive film 201 is constituted of a conductor such as copper, aluminum or the like. The first conductive films 201 are called "redistribution wirings". As shown in FIG. 1, the first conductive films 201 are extended ever the first through electrodes 102 and the connecting bumps 504a to enable the connecting bumps 504a corresponding to junctions among the semiconductor chip 501a and the second through electrodes 502a to be set to predetermined positions. The first conductive films 201 are formed by a semiconductor process. They are formed by, for example, forming a conductive film over the whole area of the first surface 111 of the semiconductor substrate 101 by sputtering and patterning it by photolitho-etching. Thus, each wiring width of the semiconductor substrate 101 can be set to 5 μm or so. This can adapt even to the multi-pin configuration and multifunctioning of the semiconductor device 001.

Second conductive films 202 each provided with a third portion connected to the first through electrode 102 and a fourth portion connected to the first conductor 301 are formed on the second surface 112. By allowing the second conductive film 202 to extend over the first through electrode 102 and the first conductor 301, the first conductor 301 can be set to a predetermined position. Incidentally, the second conductive film 202 is assumed to have a configuration similar to the first conductive film 201.

Each of the external connecting terminals 303 is connected to the fourth surface 312 of the first conductor 301. The external connecting terminal 303 is connected to the printed circuit board 401 upon mounting. The external connecting terminal 303 is constituted of a conductor such as solder, lead-free solder, lead and tin or the like. Incidentally, although the external connecting terminal 303 is set spherical in FIG. 2, for example, a plated layer is formed on the fourth surface 312 of the first conductor 301 and the formed plated layer may be used as the external connecting terminal 303.

The second through electrodes 502a, which extend through a fifth surface 511a and a sixth surface 512a including at least one circuit element 503a, are formed in the semiconductor chip 501a mounted onto the semiconductor substrate 101. The second through electrodes 502a are connected to their corresponding circuit element 503a via wirings formed on the fifth surface 511a. Each of the second through electrodes 502a is constituted of a conductor and made up of, for example, copper, aluminum or polysilicon or the like. Since the second through electrodes 502a may be formed in such a manner that at least parts of the ends of the second through electrodes 502a are exposed to the fifth surface 511a and the sixth surface 512a, sectional shapes of the second through electrodes 502a are not specified in particular. The second through electrodes 502a are formed by a semiconductor process. Thus, since the second through electrodes 502a can be formed in a process step similar to a process step for fabricating the circuit element 503a, they can be fabricated without greatly increasing their manufacturing costs.

The connecting bumps 504a and 504b are respectively formed at both ends of the second through electrodes 502a of the semiconductor chip 501a. The connecting bumps 504a and 504b are respectively constituted of a conductor such as solder or lead-free solder, copper, gold or the like.

The second through electrodes 502b, which extend through a fifth surface 511b and a sixth surface 512b including at least one circuit element 503b, are formed in the semiconductor chip 501b mounted onto the semiconductor chip 501a. Incidentally, the semiconductor chip 501b and the second through electrodes 502b are respectively assumed to have configurations similar to the semiconductor chip 501a and the second through electrodes 502a.

The connecting bumps 504c connected to the second through electrodes 502b and the connecting bumps 504b on the semiconductor chip 501a are respectively formed on the fifth surface 511b of the semiconductor chip 501b. Incidentally, the connecting bumps 504c are assumed to have configurations similar to the connecting bumps 504a and 504b.

As described above, the transfer of signals among the semiconductor substrate 101, the semiconductor chip 501a and the semiconductor chip 501b is performed via the second through electrodes 502a and the second through electrodes 502b. Thus, as compared with the semiconductor device wherein the semiconductor substrate 101, the semiconductor chip 501a and the semiconductor chip 501b are connected via wires, a wiring length between the semiconductor substrate 101 and the semiconductor chip 501a and a wiring length between the semiconductor chip 501a and the semiconductor chip 501b can be shortened. It is therefore possible to perform signal transmission of the circuit elements 503a and 503b at high speed and enhance packaging densities. Since the semiconductor substrate 101, the semiconductor chip 501a and the semiconductor chip 501b are respectively connected via the second through electrodes 502a and the second through electrodes 502b, the surfaces to form the circuit elements 503a and 503b are not specified in particular. For example, the circuit element 503a may be formed in the fifth surface 511a of the semiconductor chip 501a, and the circuit element 503b may be formed in the sixth surface 512b of the semiconductor chip 501b.

The encapsulating layers 601 are formed between the semiconductor substrate 101 and the semiconductor chip 501a and between the semiconductor chip 501a and the semiconductor chip 501b so as to cover the side portions of the first conductive films 201 of the semiconductor substrate 101 and the connecting bumps 504a, 504b and 504c, the second through electrodes 502a, the second through electrodes 502b, the circuit element 503a, and the circuit element 503b. The encapsulating layer 601 is constituted of an insulator and made up of, for example, a solid resin, a liquid resin such as epoxy. Thus, it is possible to reduce the possibility that the first conductive films 201, the circuit element 503a, the circuit element 503b, the connecting bumps 504a, the connecting bumps 504b and the connecting bumps 504c will be brought into contact with one another at locations other than predetermined portions or regions to make short circuits. It is also possible to reduce the possibility that parts of the first conductive films 201, the circuit element 503a, the circuit element 503b, the connecting bumps 504a, the connecting bumps 504b and the connecting bumps 504c will break. Further, the encapsulating layers 601 may preferably be formed so as to be charged into space defined between the semiconductor substrate 101 and the semiconductor chip 501a, which is provided by forming the connecting bumps 504a and space defined between the semiconductor chip 501a and the semiconductor chip 501b, which is provided by forming the connecting bumps 504b and the connecting bumps 504c. Thus, reflow resistance of the semiconductor device 001 can be enhanced.

The encapsulator 602 is formed around the first surface 111 of the semiconductor substrate, the semiconductor chip 501a and the semiconductor chip 501b so as to cover at least the semiconductor chip 501a, the semiconductor chip 501b, the first surface 111 and the first conductive films 201. The encapsulator 602 is an insulator and is constituted of a resin such as an epoxy resin or the like. It is thus possible to reduce the possibility that the first conductive films 201 will contact at locations other than predetermined regions to make short circuits. It is also possible to reduce the possibility that some of the first conductive films 201 will break. Further, since the encapsulator 602 is formed so as to seal even portions having the possibility of causing sealing leakage, of the space between the semiconductor chip 501a and the semiconductor substrate 101 and the space between the semiconductor chip 501a and the semiconductor chip 501b both of which are sealed with the encapsulating layers 601, the reflow resistance of the semiconductor device 001 can also be enhanced. The encapsulator 602 may preferably be mixed with glass particles. Although a cut cross-section becomes rough upon fractionization of a wafer when the glass particles are mixed therein, an improvement in reflow resistance and a reduction in warpage of the semiconductor device 001 can be carried out. That is, ease of piece processing is placed in a trade-off relationship between the enhancement of reflow resistance and the reduction in warpage of the semiconductor device 001. Thus, the mixing of the glass particles therein enables settings to the three conditions of reflow resistance, warpage and ease of fraction processing. Further, it is desirable to contain ceramic into the encapsulator 602. It is thus possible to enhance dissipation of the semiconductor device 001.

Figure 3:
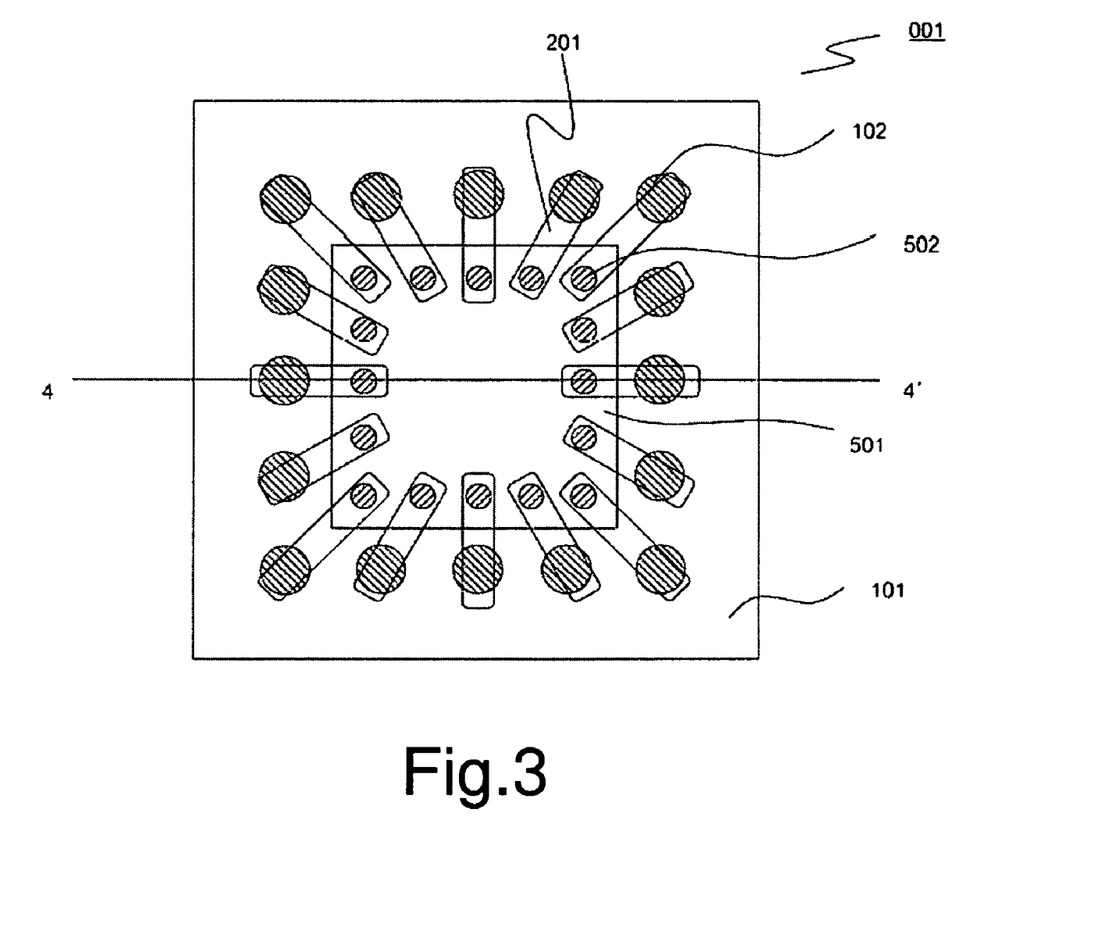
FIG. 3 is a plan view for describing a structure of a semiconductor device showing a modification of the first embodiment.
Figure 4:
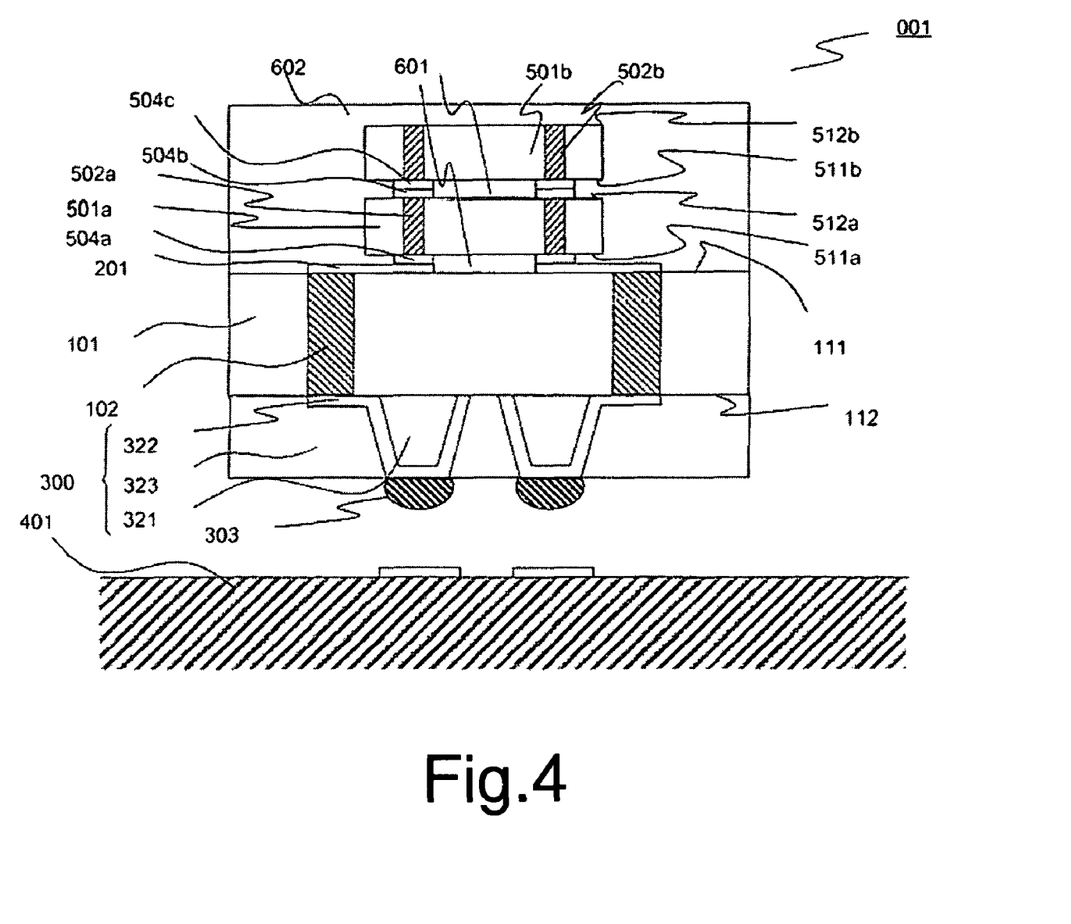
FIG. 4 is a sectional view for describing the structure of the semiconductor device showing the modification of the first embodiment.

A modification of the first embodiment will next be explained. FIG. 3 is a plan view showing a modification of the structure of the semiconductor device 001 according to the first embodiment of the present invention, and FIG. 4 is a cross-sectional view taken along line 4-4' of FIG. 3, respectively. Incidentally, FIG. 3 is shown as a plan view as seen through a semiconductor chip 501 and first conductive films 201 to make it easy to understand the construction of the semiconductor device 001 according to the modification of the first embodiment.

In the modification of the present embodiment, as shown in FIG. 4, a stress relaxing section 300 has a first insulator 321 formed so as to expose at least part of the surface of each first through electrode 102 to a second surface 112 of a semiconductor substrate 101 and having elasticity, and a first conductor 322 having flexibility, which has a fifth portion formed in a second surface 112 and connected to its corresponding first through electrode 102 and a sixth portion formed between each of external connecting terminals 303 and the first insulator 321.

Since the stress relaxing section 300 has such a configuration as described above, the first conductor 322 can be deformed by deformation of the first insulator 321 even though stress based on thermal expansion or heat shrinkage occurs between the semiconductor substrate 101 and a printed circuit board 401 different in linear expansion coefficient, whereby the position of each external connecting terminal 303 can be displaced in the direction of the second surface 112. It is thus possible to relax stress developed upon mounting with heat treatment and prevent failures in connection due to cracks or the like of the external connecting terminals 303, which occur upon mounting. The first insulator 321 is comprised of a material having elasticity, e.g., an epoxy resin or the like. The shape of the first insulator 321 may preferably be provided in protruded form, for example as shown in FIG. 4. The first conductor 322 is constituted of, for example, copper or the like.

The semiconductor device has configurations similar to the first embodiment as to configurations other than the configuration of the stress relaxing section 300.

Second Preferred Embodiment

Figure 5:
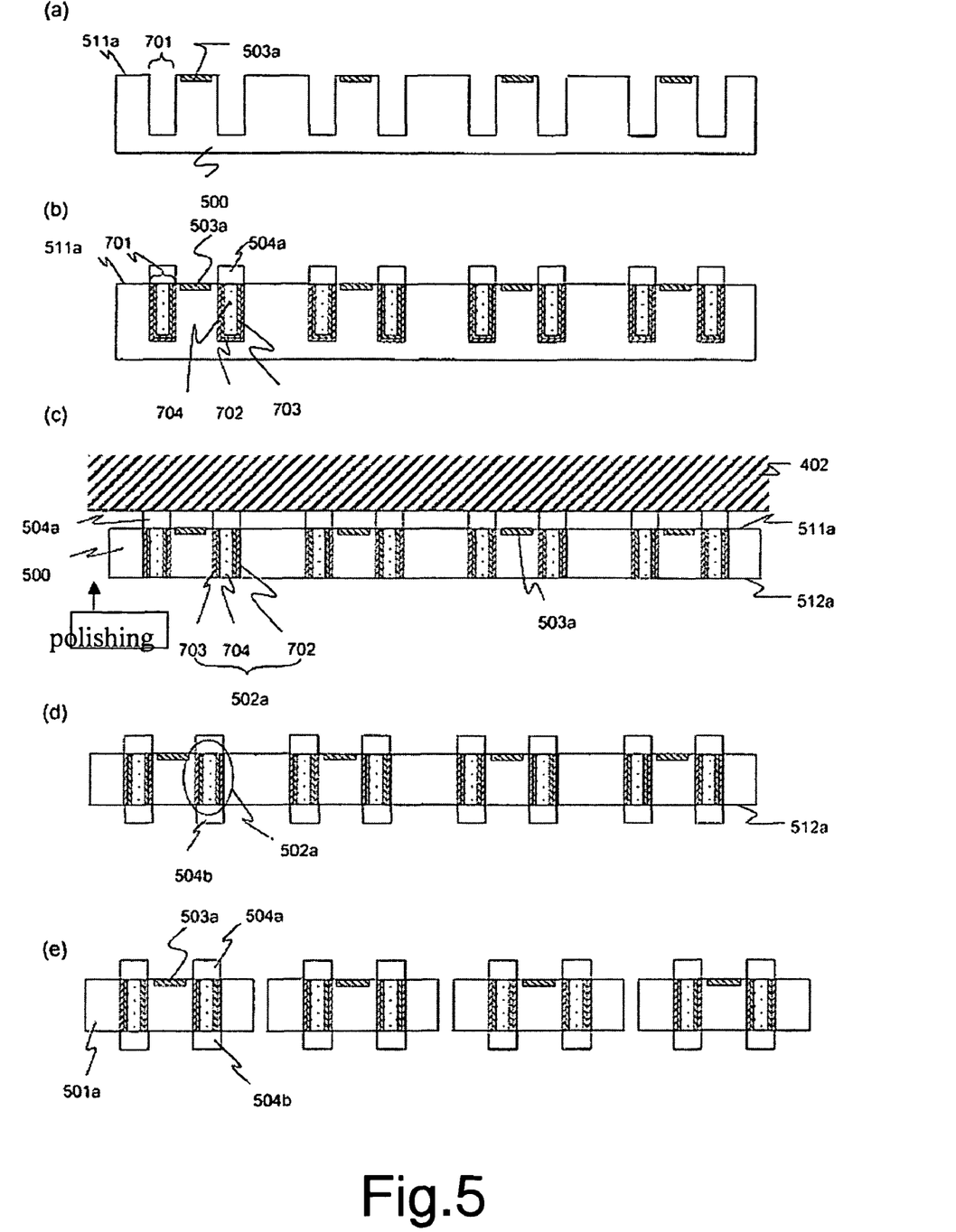
FIG. 5 is a process view for describing a first process employed in a method for manufacturing a semiconductor device, according to a second embodiment.
Figure 6:
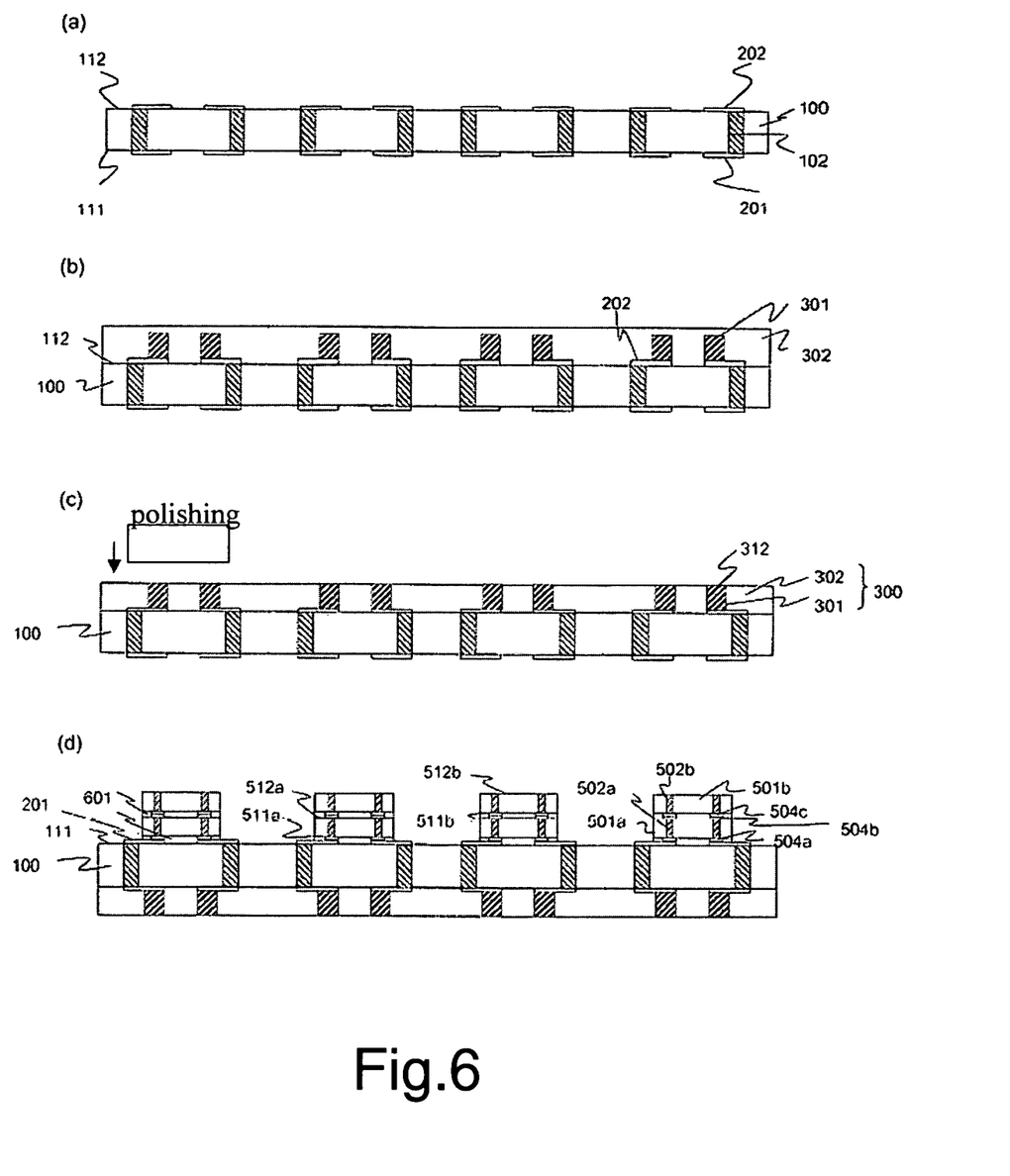
FIG. 6 is a process view for describing a second process employed in the semiconductor device manufacturing method according to the second embodiment.
Figure 7:
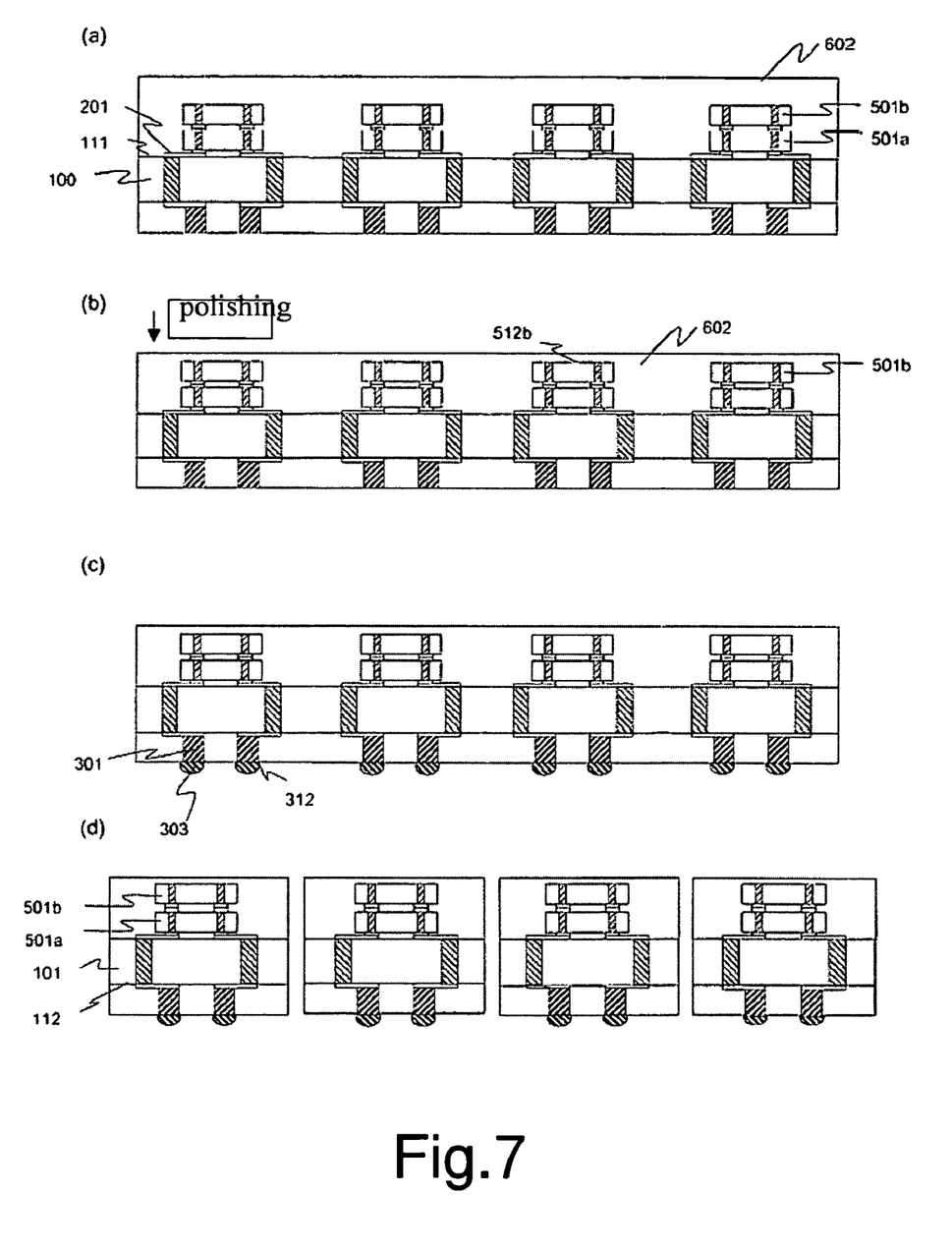
FIG. 7 is a process view for describing a second process employed in the semiconductor device manufacturing method according to the second embodiment.

A method for manufacturing the semiconductor device according to the first embodiment of the present invention will be explained as a second embodiment of the present invention. For simplification of description, a process (process for manufacturing a semiconductor chip 501a and a semiconductor chip 501b, which is carried out before being mounted onto a semiconductor substrate 101) up to the formation of second through electrodes 502a, second through electrodes 502b, connecting bumps 504a, connecting bumps 504b and connecting bumps 504c in the semiconductor chip 501a and the semiconductor chip 501b is referred to as "a first process". Its subsequent process is called "a second process". They will be described respectively. The first process is shown in FIGS. 5(a)-5(e), and the second process is shown in FIGS. 6(a)-6(d) and 7(a)-7(d).

The first process of the second embodiment will first be explained. Incidentally, only the process for forming the second through electrodes 502a, connecting bumps 504a and connecting bumps 504b in the semiconductor chip 501a will be explained below. A process corresponding to a similar process, for forming the second through electrodes 502b and connecting bumps 504c in the semiconductor chip 501b will be omitted.

As shown in FIG. 5(a), a wafer 500 having a plurality of comparted circuit element regions is first prepared.

Next, trenches 701 are defined in a fifth surface 511a having circuit elements 503a of the wafer 500. The trenches 701 are formed by dry etching after a mask is fabricated by, photolitho-etching, for example. The depth of each trench 701 is greater than or equal to, for example, 100 μm with respect to the thickness 760 μm of the wafer. The diameter thereof ranges from 10 μm to 20 μm, for example.

Next, as shown in FIG. 5(b), an insulating film 702, which covers side and bottom faces of the trenches 71, is constituted of an insulator such as silicon oxide or the like. The insulating film 702 is formed by chemical vapor deposition (CVD) or the like.

Further, each trench 701 covered with the insulating film 702 may preferably be covered with a third conductive film 703. The third conductive film 703 is constituted of a conductor such as copper. The third conductive film 703 is formed by CVD or the like and serves as a bed or base of a second conductor 704 formed by an electrolytic plating method.

Next, the second conductor 704 is formed so as to be charged into each trench 701 covered with the insulating film 702 and the third conductive film 703. The second conductor 704 is constituted of a conductor such as copper, aluminum, polysilicon or the like. The second conductors 704 are formed by forming a mask at positions excluding the trenches 701 by photolitho-etching and thereafter charging conductors into the trenches 701 by the electrolytic plating method. As another forming method, there is also known a method for depositing a second conductor 704 over a fifth surface 511a formed with trenches 701 until the trenches 701 are charged by the electrolytic plating method and thereafter polishing the fifth surface 511a by mechanical polishing or chemical mechanical polishing (CMP) or the like until the second conductor 704 formed except for the trenches 701 can be removed.

Next, a wiring for electrically connecting the second conductor 704 of each trench 701 and its corresponding circuit element 503a is formed in the fifth surface 511a (not shown). The wirings for connecting the second conductors 704 of the trenches 701 and their corresponding circuit elements 503a can be formed by forming a conductive film such as copper, aluminum or the like in the fifth surface 511a of the wafer 500 by CVD or the like and patterning it by photolitho-etching. Further, it is desirable that electrode pads are formed in advance in a process for forming the circuit elements 503a, and the trench 701, insulating film 702, conductive film 703 and second conductor 704 are formed at each electrode pad. It is thus possible to omit the process of forming the wirings electrically connected to the circuit elements 503a after the formation of the second conductor 704.

Next, connecting bumps 504a each connected to the second conductor 704 of the trench 701 are formed on the fifth surface 511a. The connecting bumps 504a are formed by forming a mask at positions excluding the second conductors 704 by photolitho-etching, forming conductors on the upper surfaces of the second conductors 704 by sputtering, plating or the like and thereafter removing the mask.

Next, as shown in FIG. 5(c), the connecting bumps 504a formed on the fifth surface 511a are mounted onto a support table 402. A sixth surface 512a is polished until at least the second conductors 704 are exposed. This polishing is performed by mechanical polishing or chemical mechanical polishing, for example. By exposing the second conductors 704 of the trenches 701, the second through electrodes 502a can be formed. Since the process of forming the second through electrodes 502a can be performed by a semiconductor process in a manner similar to the process of forming the circuit elements 503a, the second through electrodes 502a can be fabricated without greatly increasing their manufacturing costs. It is further desirable that the polishing is performed in such a manner that the thickness of the wafer 500 configured as semiconductor chips 501a by fractionizing ranges from 20 μm to 100 μm. With the execution of polishing under the above condition, the semiconductor chip 501a can be prevented from being cracked and thin-fractionizing of the semiconductor chips 501a is enabled, thus making it possible to enhance the packaging density of each semiconductor device 001.

Next, as shown in FIG. 5(d), connecting bumps 504b connected to the second through electrodes 502a are formed on the sixth surface 512a. Incidentally, a method similar to the connecting bumps 504a is used as a method for fabricating the connecting bumps 504b.

Finally, as shown in FIG. 5(e), the wafer 500 formed with the plurality of circuit element regions is divided into fractions or pieces every circuit element regions by, for example, a mechanical process, whereby the individual semiconductor chips 501a that connect the connecting bumps 504a and the connecting bumps 504b are formed.

In the first process, the connecting bumps 504a are formed on the fifth surface 511a and thereafter the sixth surface 512a is polished to form the connecting bumps 504a on the sixth surface 512a. After the polishing of the sixth surface 512a, however, the connecting bumps 504a and 504b may respectively be formed on the fifth surface 511a and the sixth surface 512a. Since the semiconductor chip 501a is connected to the semiconductor chip 501b and the semiconductor substrate 101 via the second through electrodes 502a, the circuit element 503a may be formed in either the fifth surface 511a or the sixth surface 512a.

The second process of the second embodiment will next be explained.

As shown in FIG. 6(a), a wafer 100 having a plurality of chip regions each to have a semiconductor chip 501a and a semiconductor chip 501b mounted thereon, is first prepared.

Next, first through electrodes 102 are formed in the wafer 100. Incidentally, a method for fabricating the first through electrodes 102 is a method similar to the method for manufacturing the second through electrodes 502a of the wafer 500 according to the present embodiment. It is further desirable that the polishing is performed in such a manner that the thickness of the wafer 100 configured as the semiconductor substrates 101 by fractionizing ranges from 200 μm to 500 μm. With the execution of polishing under the above condition, the semiconductor substrate 101 can be prevented from being flexed upon lamination of the semiconductor chip 501a and the semiconductor chip 501b, and thin-fractionizing of the semiconductor substrate 101 is enabled, whereby the packaging density of the semiconductor device 001 can be enhanced.

Next, first conductive films 201 are formed on a first surface 111 of the wafer 100. A conductive film is formed on the first surface 111 of the wafer 100 by sputtering and patterned by photolitho-etching to thereby form the first conductive films 201 on the first surface 111 of the wafer 100.

Next, the wafer 100 is turned upside down and second conductive films 202 are formed on a second surface 112 of the wafer 100. A conductive film is formed on the second surface 112 of the wafer 100 by sputtering and patterned by photolitho-etching to thereby form the second conductive films 202 on the second surface 112 of the wafer 100.

Next, as shown in FIG. 6(b), first conductors 301 respectively connected to the second conductive films 202 are formed on the second surface 112 of the wafer 100. A mask is patterned by photolitho-etching and thereafter conductors are deposited on predetermined positions by an electrolytic plating method. Afterwards, the patterned masks are removed to form the first conductors 301.

Next, a first insulator 302, e.g., a resin is formed on the second surface 112 of the wafer 100 formed with the second conductive films 202 and the first conductors 301. At this time, the first insulator 302 is formed so as to cover the second surface 112 of the wafer 100, the second conductive films 202 and the first conductors 301.

Next, as shown in FIG. 6(c), the first insulator 302 is polished such that a fourth surface 312 of each first conductor 301 is exposed. This polishing is done by, for example, mechanical polishing or chemical mechanical polishing. By forming the first conductors 301 and the first insulator 302 as described above, a stress relaxing section 300 comprised of the first conductor 301 and the first insulator 302 is fabricated. It is further desirable that the polishing is done such that the distance between the second surface 112 of the wafer 100 and the fourth surface 312 of the first conductor 301 ranges from 50 μm to 200 μm. With the execution of polishing under the above condition, failures in connection subsequent to mounting can be reduced, and thin-fractionizing of the stress relaxing section 300 is enabled, thus making it possible to enhance the packaging density of each semiconductor device 001.

Next, the wafer 100 is turned upside down. Thereafter, as shown in FIG. 6(d), the semiconductor chips 501a are mounted over the first surface 111 of the wafer 100 every plural chip regions of the wafer 100. At this time, the first conductive films 201 and their corresponding connecting bumps 504a are formed so as to be connected to one another. Further, the semiconductor chip 501b is mounted over its corresponding sixth surface 512a of the semiconductor chip 501a. At this time, connecting bumps 504b of the semiconductor chip 501a and their corresponding connecting bumps 504c of the semiconductor chip 501b are formed so as to be connected to one another.

Next, encapsulating layers 601 are implanted between the wafer 100 and the semiconductor chip 501a and between the semiconductor chip 501a and the semiconductor chip 501b from the side portions of the wafer 100, semiconductor chip 501a and semiconductor chip 501b. The encapsulating layers 601 at this time consist of a liquid resin, for example. The encapsulating layers 601 may be implanted collectively after the mounting of the semiconductor chips 501a and 501b. Alternatively, the semiconductor chips 501a and 501b may be laminated and connected whenever necessary while the encapsulating layers 601 are being implanted.

As a method for forming the encapsulating layers 601, there is also known a method shown below. The encapsulating layers 601 are applied onto the single sides or both sides of the semiconductor chips 501a and 501b in advance. At this time, at least circuit elements 503a (not shown) and 503b (not shown), and the side portions of the connecting bumps 504a, 504b and 504c may be covered. Thereafter, the semiconductor chips 501a and 501b are laminated and heat-treated to form the corresponding encapsulating layers 601. The encapsulating layers 601 at this time are comprised of a solid resin, for example.

Next, as shown in FIG. 7(a), an encapsulating body or encapsulator 602 is formed so as to cover the first surface 111 of the wafer 100, the first conductive films 201, the semiconductor chips 501a and the semiconductor chips 501b.

Next, as shown in FIG. 7(b), the upper surface of the encapsulator 602 is polished. This polishing is done by, for example, mechanical polishing or chemical mechanical polishing. It is further desirable that the polishing is done in such a manner that the distance between a sixth surface 512b of each semiconductor chip 501b and the upper surface of the encapsulator 602 becomes 100 μm or less. Thus, the packaging density of each semiconductor device 001 can be enhanced. Incidentally, the encapsulator 602 may be formed in advance in such a manner that the distance between the sixth surface 512b of the semiconductor chip 501b and the upper surface of the encapsulator 602 reaches 100 μm or less. It is thus possible to omit a process step for polishing the encapsulator 602.

Next, as shown in FIG. 7(c), external connecting terminals 303 connected to their corresponding fourth surfaces 312 of the first conductors 301 are formed.

Finally, as shown in FIG. 7(d), the wafer 100 is fractionized or individualized every chip regions in accordance with, for example, a mechanical process to thereby obtain the individual semiconductor devices 001 in each of which the semiconductor chips 501a and 501b are laminated over the semiconductor substrate 101. Incidentally, the first insulator 302 formed on the second surface 112 is polished until the first conductors 301 are exposed, before the mounting of the semiconductor chips 501a and 501b in the above process. However, the present polishing may be carried out after the mounting of the semiconductor chips 501a and 501b and the formation of the encapsulator 602 on the first surface 111.

Figure 8:
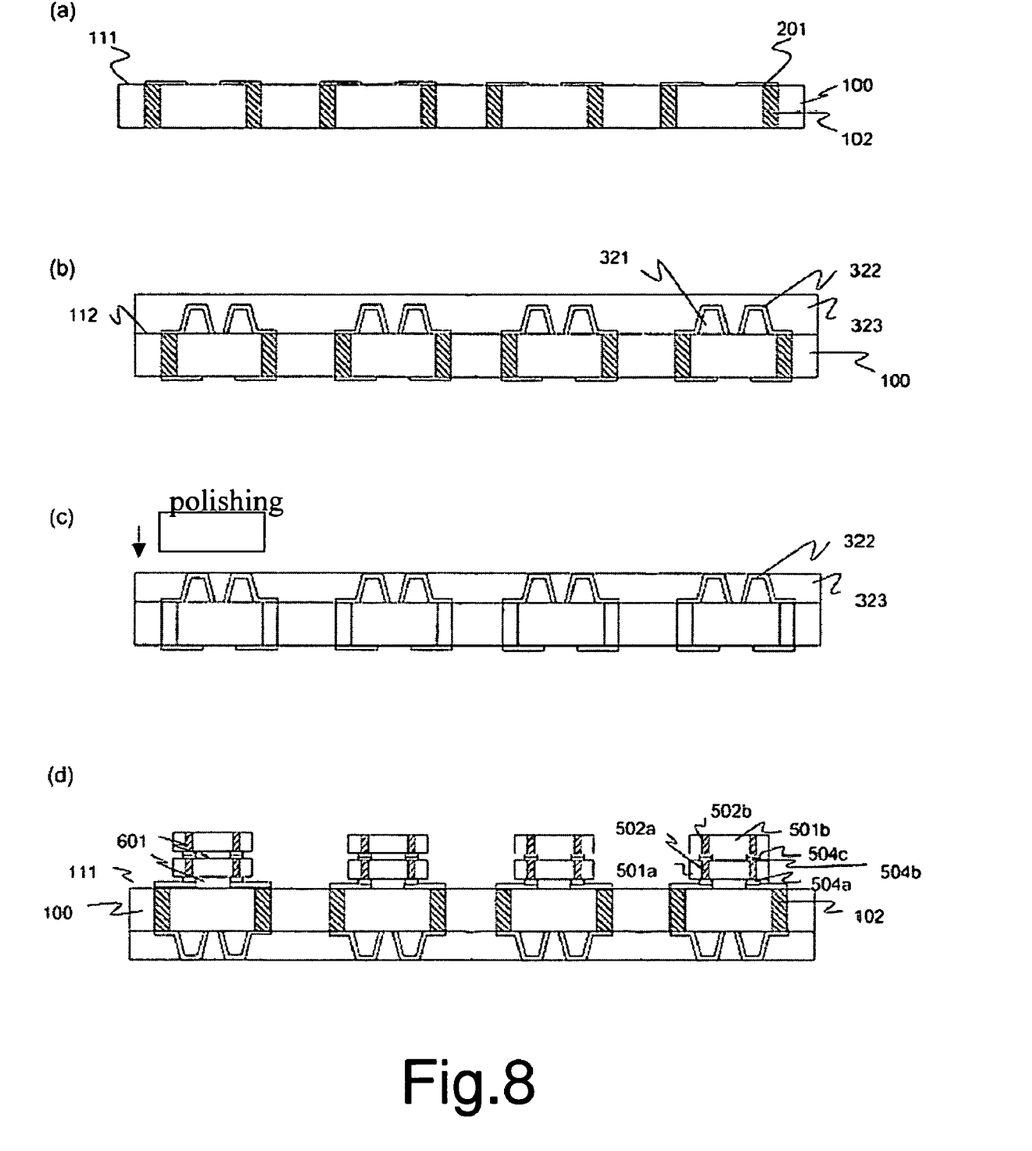
FIG. 8 is a process view for describing a second process employed in a method for manufacturing a semiconductor device, showing a modification of the second embodiment.
Figure 9:
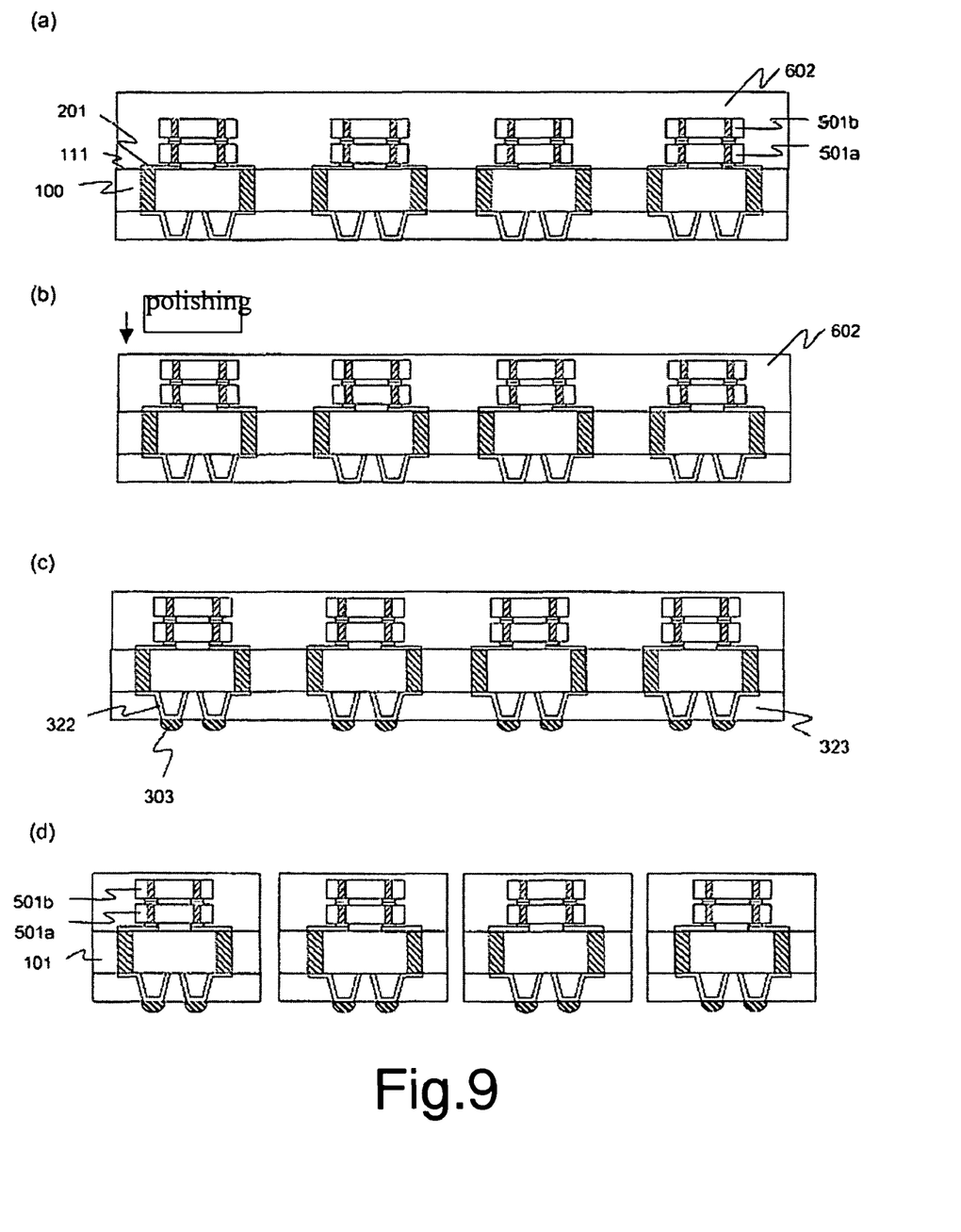
FIG. 9 is a process view for describing a second process employed in the semiconductor device manufacturing method showing the modification of the second embodiment.

A manufacturing method adapted to the modification of the first embodiment of the present invention will next be explained as a modification of the second embodiment. Incidentally, a first process corresponding to a process (process for manufacturing a semiconductor chip 501a and a semiconductor chip 501b, which is carried out before being mounted onto a semiconductor substrate 101) up to the formation of second through electrodes 502a, second through electrodes 502b, connecting bumps 504a, connecting bumps 504b and connecting bumps 504c in the semiconductor chip 501a and the semiconductor chip 501b is omitted because it is similar to the second embodiment. Only a second process corresponding to its subsequent process will be explained. The second process is shown in FIGS. 8(a)-8(d) and 9(a)-9(d).

As shown in FIG. 8(a), a wafer 100 having a plurality of chip regions each having a semiconductor chip 501a and a semiconductor chip 501b mounted thereon, is first prepared.

Next, first through electrodes 102 are formed in the wafer 100. Incidentally, a method for fabricating the first through electrodes 102 is a method similar to the second embodiment of the present invention.

Next, the wafer 100 is turned upside down. Thereafter, first conductive films 201 are formed on a first surface 111 of the wafer 100. Incidentally, a method for fabricating the first conductive films 201 is a method similar to the second embodiment of the present invention.

Next, as shown in FIG. 8(b), a first insulator 321, e.g., a resin is formed on a second surface 112 of the wafer 100. At this time, the first insulator 321 is formed so that at least part of each first through electrode 102 is exposed.

Next, a first conductor 322 is connected to its corresponding first through electrode 102 and formed on the second surface 112 so as to cover the upper surface of at least each first insulator 321.

Next, a second insulator 323, e.g., a resin is formed over the second surface 112 and the first insulators 321. At this time, the second insulator 323 is formed so that the second surface 112 of the wafer 100 and the first conductor 322 are covered therewith.

Next, as shown in FIG. 8(c), the second insulator 323 is polished such that the upper portion of the first conductor 322 is exposed. This polishing is carried out by, for example, mechanical polishing or chemical mechanical polishing.

Next, the wafer 100 is turned upside down. Thereafter, as shown in FIG. 8(d), the semiconductor chips 501a and the semiconductor chips 501b are sequentially mounted over the first surface 111 of the wafer 100 every plural chip regions of the wafer 100. The first through electrodes 102, the second through electrodes 502a and the second through electrodes 502b are respectively connected to one another via the connecting bumps 504a, connecting bumps 504b and connecting bumps 504c. Incidentally, methods for mounting and connecting the semiconductor chips 501a and 501b are methods similar to the second embodiment of the present invention.

Next, encapsulating layers 601 are implanted between the wafer 100 and the semiconductor chip 501a and between the semiconductor chip 501a and the semiconductor chip 501b from the side portions of the wafer 100, semiconductor chip 501a and semiconductor chip 501b. Incidentally, a method for fabricating the encapsulating layers 601 is a method similar to the second embodiment of the present invention.

Next, as shown in FIG. 9(a), an encapsulating body or encapsulator 602 is formed so as to cover the first surface 111 of the wafer 100, the first conductive films 201, the semiconductor chips 501a and the semiconductor chips 501b. Incidentally, a method for manufacturing the encapsulator 602 is a method similar to the second embodiment of the present invention.

Next, as shown in FIG. 9(b), the upper surface of the encapsulator 602 is polished. Incidentally, a method for polishing the encapsulator 602 is a method similar to the second embodiment of the present invention.

Next, as shown in FIG. 9(c), external connecting terminals 303 connected to their corresponding first conductors 322 exposed from the second insulator 323 are formed.

Finally, as shown in FIG. 9(d), the wafer 100 is fractionized or individualized every chip regions to thereby obtain the individual semiconductor devices 001 in each of which the semiconductor chips 501a and 501b are laminated over the semiconductor substrate 101. Incidentally, a method for dividing the wafer 100 into fractions or pieces is a method similar to the second embodiment of the present invention.

While the preferred forms of the present invention have been described, it is to be understood that modifications will be apparent to those skilled in the art without departing from the spirit of the invention. The scope of the invention is to be determined solely by the following claims.

As described above, according to the invention, a method for manufacturing a semiconductor device, comprising the steps of preparing a wafer in which a plurality of chip regions each having a first surface, a second surface corresponding to a back surface with respect to the first surface, and first through electrodes extending through the first surface and the second surface are formed in matrix form, forming stress relaxing sections each provided with a first conductor electrically connected to the first through electrode and having flexibility, over the second surfaces of the respective chip regions, forming external connecting terminals over the respective stress relaxing sections so as to electrically connect to the first conductors, mounting semiconductor chips over the first surfaces of the respective chip regions in such a manner that circuit elements of the semiconductor chips and the first through electrodes are electrically connected and dividing the wafer into fractions every said chip regions.

It is preferable that said step for forming the stress relaxing sections over the second surfaces of the respective chip regions has a step for forming, over the second surfaces of the respective chip regions, first conductors each having a third surface opposite to the second surface and electrically connected to the corresponding first through electrode, a fourth surface corresponding to a back surface with respect to the third surface and connected to the corresponding external connecting terminal, and a side surface that connects the third surface and the fourth surface.

The method further includes a step for, after execution of the step for forming the first conductors over the second surfaces of the respective chip regions, forming a first insulator over the second surface of said each chip region so as to cover the fourth surface and the side surface of said each first conductor, and the second surface, and a step for polishing the first insulator until the first conductors are exposed.

It is preferable that said step for polishing the first insulator until the first conductors are exposed, the first conductors are polished until they reach a thickness ranging from 50 µm to 200 µm.

The method further includes a step for forming first conductive films each having a first portion connected to the corresponding first through electrode and a second portion connected to the third surface of the first conductor, over the second surfaces of the respective chip regions.

The method further includes a step for forming second conductive films each having a third portion connected to the corresponding first through electrode of the chip region and a fourth portion electrically connected to the circuit element of the semiconductor chip, over the first surfaces of the respective chip regions.

The method further includes a step for forming, in the corresponding semiconductor chip having a fifth surface opposite to the first surface of the chip region and a sixth surface corresponding to a back surface with respect to the fifth surface, second through electrodes electrically connected to the circuit element and extending through the fifth surface and the sixth surface, and a step for forming first connecting bumps each connected to the fourth portion of the second conductive film over the fifth surface of the corresponding semiconductor chip.

It is preferable that said step for forming the second through electrodes in the semiconductor chip includes, a step for forming trenches in a circuit forming surface formed with the circuit element of the semiconductor chip, a step for covering at least side portions of the trenches with an insulating film, a step for charging a second conductor into said each trench covered with the insulating film, and a step for polishing a back surface of the circuit forming surface of the semiconductor chip until the second conductors are exposed.

It is preferable that the polishing of the back surface of the circuit element forming surface in the semiconductor chip is performed in such a manner that the semiconductor chip reaches a thickness ranging from 20 µm to 100 µm.

The method further includes a step for forming encapsulating layers among the first surfaces of the respective chip regions and the fifth surfaces of the respective semiconductor chips so as to cover the second conductive films.

The method further includes a step for covering the respective semiconductor chips and the respective first surfaces with an encapsulator, and a step for polishing an upper surface of the encapsulator.

It is also preferable that the polishing of the upper surface of the encapsulator is performed in such a manner that the distance between the upper surface of the encapsulator and the sixth surface of the corresponding semiconductor chip becomes 100 µm or less.

It is preferable that said step for forming the stress relaxing sections each provided with the first conductor having flexibility, over the second surfaces of the respective chip regions includes, a step for forming a first insulator over the second surface of each of the chip regions so as to expose at least part of the surface of each of the first through electrodes, and a step for forming first conductors each having a fifth portion connected to the corresponding first through electrode and a sixth portion formed between each of the external connecting terminals and the first insulator, over the second surfaces of the respective chip regions.

What is claimed is:
1. A semiconductor device comprising:
a semiconductor substrate including a first surface and a second surface corresponding to a back surface with respect to the first surface and having first through electrodes which extend through the first surface and the second surface;
a semiconductor chip over the first surface of the semiconductor substrate, the semiconductor chip is comprised of a same material as the semiconductor substrate and has a circuit element electrically connected to the first through electrodes;
a stress relaxing section including first conductors over the second surface of the semiconductor substrate and electrically connected to the first through electrodes of the semiconductor substrate and having flexibility, the stress relaxing section including a first insulator over the second surface of the semiconductor substrate so as to cover the side surfaces of the first conductors and the second surface of the semiconductor substrate, and having elasticity, the first conductors have columnar shape;
external connecting terminals over the stress relaxing section and connected to the first conductors respectively,
wherein each of the first conductors of the stress relaxing section has a third surface opposite to the second surface of the semiconductor substrate and electrically connected to a corresponding first through electrode, a fourth surface corresponding to a back surface with respect to the third surface and connected to a corresponding external connecting terminal, and a side surface that connects the third surface and the fourth surface,
wherein the semiconductor substrate, the semiconductor chip and the stress relaxing section are configured together as a semiconductor package,
wherein the semiconductor package is on a circuit board with the stress relaxing section facing the circuit board, a linear expansion coefficient of the circuit board being different than a linear expansion coefficient of the semiconductor substrate, and wherein a planar size of the stress relaxing section and a planar size of the semiconductor substrate are the same; and conductive films over the second surface of the semiconductor substrate, the conductive films each having a first portion connected to a corresponding first through electrode of the semiconductor substrate and a second portion connected to the third surface of a corresponding first conductor.

2. The semiconductor device according to claim 1, wherein the first insulator comprises a resin.

3. The semiconductor device according to claim 1, further including first conductive films over the first surface of the semiconductor substrate, and each having a first portion connected to a corresponding first through electrode of the semiconductor substrate and having a second portion electrically connected to the circuit element of the semiconductor chip.

4. The semiconductor device according to claim 3, further including encapsulating layers among the semiconductor substrate and the semiconductor chip so as to cover the first conductive films.

5. The semiconductor device according to claim 4, wherein the encapsulating layers comprise a resin.

6. The semiconductor device according to claim 3, wherein the semiconductor chip includes second through electrodes, a fifth surface opposite to the first surface of the semiconductor substrate and a sixth surface corresponding to a back surface with respect to the fifth surface, and each of the second through electrodes extend through the fifth surface and the sixth surface and are electrically connected to the circuit element, the semiconductor device further comprising connecting bumps between the first surface of the semiconductor substrate and the fifth surface of the semiconductor chip, each of said connecting bumps being connected to the second portion of a corresponding first conductive film of the semiconductor substrate and connected to a corresponding second through electrode the semiconductor chip.

7. The semiconductor device according to claim 1, further including an encapsulator which covers the semiconductor chip and the first surface of the semiconductor substrate.

8. The semiconductor device according to claim 7, wherein the encapsulator comprises a resin.

9. The semiconductor device according to claim 7, wherein the encapsulator contains ceramic.

10. A semiconductor device comprising:
a semiconductor substrate including a first surface and a second surface corresponding to a back surface with respect to the first surface and having first through electrodes which extend through the first surface and the second surface;
semiconductor chips mounted over the first surface of the semiconductor substrate, each of said semiconductor chips being constituted of a material of the same kind as the semiconductor substrate and having a circuit element electrically connected to the first through electrodes;
stress relaxing sections including first conductors over the second surface of the semiconductor substrate and electrically connected to the first through electrodes of the semiconductor substrate and having flexibility, and including a first insulator over the second surface of the semiconductor substrate so as to cover the side surfaces of the first conductors and the second surface of the semiconductor substrate, and having elasticity; and external connecting terminals provided over the stress relaxing sections and connected to the first conductors respectively, wherein each of the first conductors of the stress relaxing sections has a third surface opposite to the second surface of the semiconductor substrate and electrically connected to the corresponding first through electrode, a fourth surface corresponding to a back surface with respect to the third surface and connected to the corresponding external connecting terminal, and a side surface that connects the third surface and the fourth surface, and wherein a distance between the second surface of the semiconductor substrate and each of the external connecting terminals is greater than or equal to 50 µm.

11. A semiconductor device comprising:
a semiconductor substrate including a first surface and a second surface corresponding to a back surface with respect to the first surface and having first through electrodes which extend through the first surface and the second surface;
a semiconductor chip over the first surface of the semiconductor substrate, the semiconductor chip is comprised of a same material as the semiconductor substrate and has a circuit element electrically connected to the first through electrodes;
a stress relaxing section including first conductors over the second surface of the semiconductor substrate and electrically connected to the first through electrodes of the semiconductor substrate and having flexibility, the stress relaxing section including a first insulator over the second surface of the semiconductor substrate so as to cover the side surfaces of the first conductors and the second surface of the semiconductor substrate, and having elasticity, the first conductors have columnar shape;
external connecting terminals over the stress relaxing section and connected to the first conductors respectively, wherein each of the first conductors of the stress relaxing section has a third surface opposite to the second surface of the semiconductor substrate and electrically connected to a corresponding first through electrode, a fourth surface corresponding to a back surface with respect to the third surface and connected to a corresponding external connecting terminal, and a side surface that connects the third surface and the fourth surface, and wherein the semiconductor substrate, the semiconductor chip and the stress relaxing section are configured together as a semiconductor package; and conductive films over the second surface of the semiconductor substrate, the conductive films each having a first portion connected to a corresponding first through electrode of the semiconductor substrate and a second portion connected to the third surface of a corresponding first conductor.

12. The semiconductor device according to claim 11, wherein the first insulator comprises a resin.

13. The semiconductor device according to claim 11, further including first conductive films over the first surface of the semiconductor substrate, and each having a first portion connected to a corresponding first through electrode of the semiconductor substrate and having a second portion electrically connected to the circuit element of the semiconductor chip.

14. The semiconductor device according to claim 13, further including encapsulating layers among the semiconductor substrate and the semiconductor chip so as to cover the first conductive films.

15. The semiconductor device according to claim 14, wherein the encapsulating layers comprise a resin.

16. The semiconductor device according to claim 13, wherein the semiconductor chip includes second through electrodes, a fifth surface opposite to the first surface of the semiconductor substrate and a sixth surface corresponding to a back surface with respect to the fifth surface, and each of the second through electrodes extend through the fifth surface and the sixth surface and are electrically connected to the circuit element, the semiconductor device further comprising connecting bumps between the first surface of the semiconductor substrate and the fifth surface of the semiconductor chip, each of said connecting bumps being connected to the second portion of a corresponding first conductive film of the semiconductor substrate and connected to a corresponding second through electrode of the semiconductor chip.

17. The semiconductor device according to claim 11, further including an encapsulator which covers the semiconductor chip and the first surface of the semiconductor substrate.

18. The semiconductor device according to claim 17, wherein the encapsulator comprises a resin.

19. The semiconductor device according to claim 17, wherein the encapsulator contains ceramic.

* * * * *